United States Patent
Yabuuchi

(10) Patent No.: US 9,508,419 B2
(45) Date of Patent: Nov. 29, 2016

(54) SEMICONDUCTOR STORAGE DEVICE AND TEST METHOD THEREOF USING A COMMON BIT LINE

(71) Applicant: Renesas Electronics Corporation, Kawasaki-shi, Kanagawa (JP)

(72) Inventor: Makoto Yabuuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/454,357

(22) Filed: Aug. 7, 2014

(65) Prior Publication Data

US 2015/0078058 A1    Mar. 19, 2015

(30) Foreign Application Priority Data

Sep. 19, 2013  (JP) ................................. 2013-194249

(51) Int. Cl.
| | |
|---|---|
| *G11C 16/10* | (2006.01) |
| *G11C 11/412* | (2006.01) |
| *G11C 7/14* | (2006.01) |
| *G11C 29/12* | (2006.01) |
| *G11C 11/419* | (2006.01) |
| *H01L 27/11* | (2006.01) |

(52) U.S. Cl.
CPC .............. *G11C 11/412* (2013.01); *G11C 7/14* (2013.01); *G11C 29/12015* (2013.01); *G11C 11/419* (2013.01); *G11C 2029/1202* (2013.01); *G11C 2029/1204* (2013.01); *H01L 27/1104* (2013.01)

(58) Field of Classification Search
CPC .. G11C 11/412; G11C 29/12015; G11C 7/14
USPC ......................................................... 365/72
See application file for complete search history.

(56) References Cited

U.S. PATENT DOCUMENTS

| | | | | |
|---|---|---|---|---|
| 5,424,977 | A * | 6/1995 | Rountree | G11C 11/4099 365/149 |
| 6,990,025 | B2 * | 1/2006 | Kirihata | G11C 8/16 365/189.04 |
| 7,196,945 | B2 | 3/2007 | Kato | |
| 7,352,617 | B2 * | 4/2008 | Kang | B82Y 10/00 257/46 |
| 8,730,750 | B1 * | 5/2014 | Trivedi | G11C 7/08 365/210.1 |
| 8,885,404 | B2 * | 11/2014 | Dutta | G11C 16/10 257/324 |
| 2003/0206429 | A2 * | 11/2003 | Subramanian | G11C 11/5692 365/103 |
| 2005/0047218 | A1 * | 3/2005 | Kirihata | G11C 8/16 365/189.07 |
| 2005/0180194 | A1 * | 8/2005 | Kang | B82Y 10/00 365/149 |

(Continued)

FOREIGN PATENT DOCUMENTS

JP          2005-050479 A      2/2005

*Primary Examiner* — Richard Elms
*Assistant Examiner* — Xiaochun L Chen
(74) *Attorney, Agent, or Firm* — Sughrue Mion, PLLC

(57) ABSTRACT

Provided is a semiconductor storage device including: first memory cells; first word lines; first bit lines; a first common bit line; second memory cells; second word lines; second bit lines; a second common bit line; a first selection circuit that connects the first common bit line to a first bit line selected from the first bit lines; a second selection circuit that connects the second common bit line to a second bit line selected from the second bit lines; a word line driver that activates any one of the first and second word lines; a reference current supply unit that supplies a reference current to a common bit line among the first and second common bit lines, the common bit line not being electrically connected to a data read target memory cell; and a sense amplifier that amplifies a potential difference between the first and second common bit lines.

12 Claims, 13 Drawing Sheets

(56) References Cited

U.S. PATENT DOCUMENTS

2011/0075470 A1* 3/2011 Liaw ................ G11C 8/16
                                              365/154

2013/0163340 A1* 6/2013 Dutta ................ G11C 16/10
                                              365/185.18
2014/0119130 A1* 5/2014 Trivedi ............... G11C 7/08
                                              365/189.02

* cited by examiner

SEMICONDUCTOR STORAGE DEVICE AND TEST METHOD THEREOF USING A COMMON BIT LINE

CROSS-REFERENCE TO RELATED APPLICATIONS

This application is based upon and claims the benefit of priority from Japanese patent application No. 2013-194249, filed on Sep. 19, 2013, the disclosure of which is incorporated herein in its entirety by reference.

BACKGROUND

The present invention relates to a semiconductor storage device and a test method thereof, and more particularly, to a semiconductor storage device suitable for, for example, suppressing an increase in circuit size, and a test method thereof.

There is a demand for miniaturization of semiconductor storage devices. In particular, there is a demand for miniaturization of semiconductor storage devices including a plurality of memory cells from which data is read by using single-ended bit lines.

Related art is disclosed in Japanese Unexamined Patent Application Publication No. 2005-50479. Japanese Unexamined Patent Application Publication No. 2005-50479 discloses a semiconductor memory including a plurality of memory cells having a single-ended digit structure. This semiconductor memory amplifies a potential difference between a potential of a single-ended digit line and a reference potential of a dummy digit line, and outputs the amplified potential difference as read data.

SUMMARY

The semiconductor memory disclosed in Japanese Unexamined Patent Application Publication No. 2005-50479 needs to be provided with a dummy digit line (dummy bit line), which causes a problem of an increase in circuit size. Other problems to be solved and novel features of the present invention will become apparent from the following description of the specification and the accompanying drawings thereof.

A first aspect of the present invention is a semiconductor storage device including a reference current supply unit that supplies a reference current to a common bit line from among first and second common bit lines, the common bit line not being electrically connected to a data read target memory cell; and a sense amplifier that amplifies a potential difference between the first and second common bit lines.

A second aspect of the present invention is a semiconductor storage device including a test control circuit that activates, during a test mode, any of write word lines, and further activates, after a lapse of a predetermined period of time, a read word line in the same row as the any of the write word lines.

A third aspect of the present invention is a test method of a semiconductor storage device, including: activating, during a test mode, any of write word lines, and further activating, after a lapse of a predetermined period of time, a read word line in the same row as the any of the write word lines.

According to the above-mentioned aspects, it is possible to provide a semiconductor storage device capable of suppressing an increase in circuit size, and a test method thereof.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
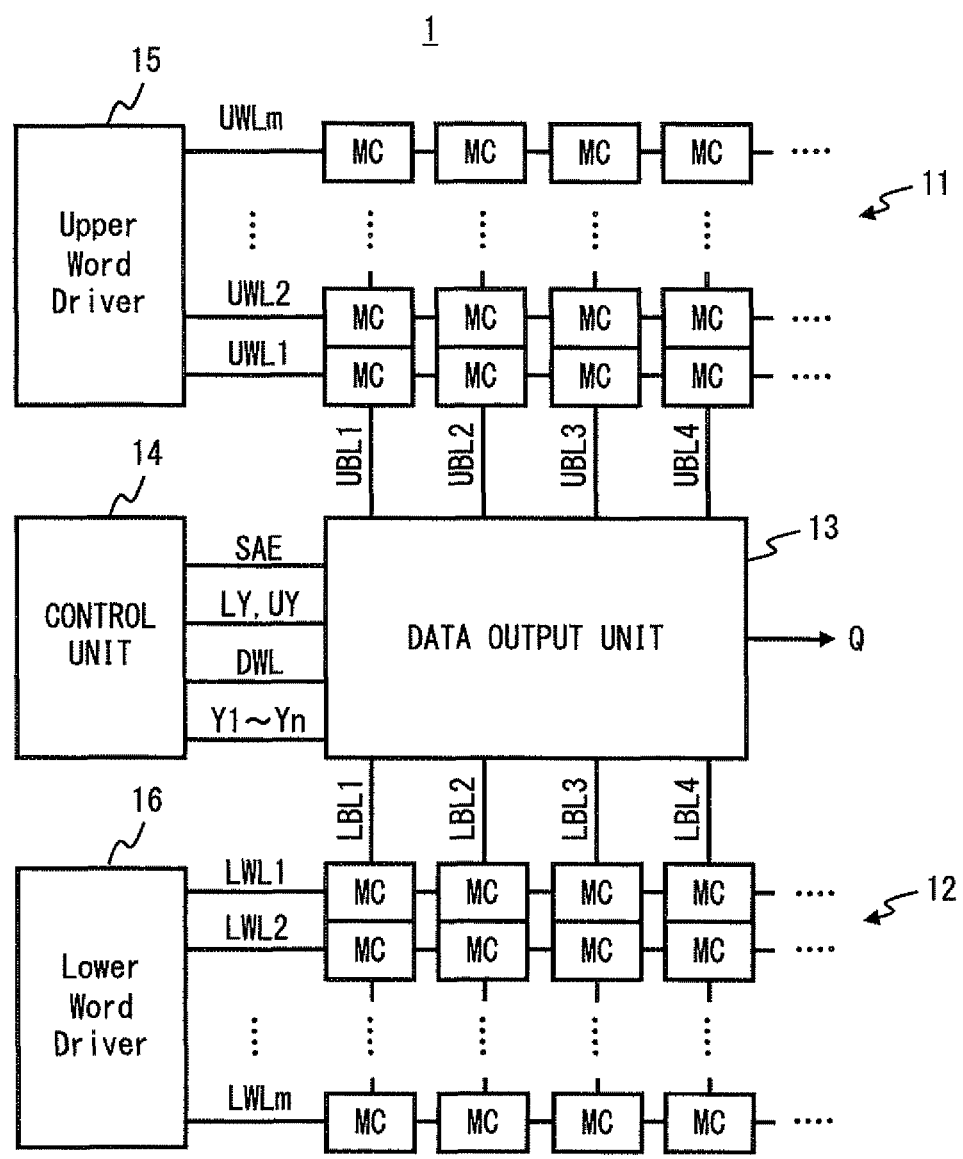
FIG. 1 is a block diagram showing a configuration example of a semiconductor storage device according to a first embodiment.

Hereinafter, embodiments will be described with reference to the drawings. The drawings are made in a simplified manner, and therefore the technical scope of embodiments should not be narrowly interpreted based on the drawings. The same components are denoted by the same reference numerals, and a repeated description thereof is omitted.

In the following embodiments, explanations are made by referring to several sections or several embodiments for convenience, as required, but they are mutually related, and are in such a relation to each other that one of them is a modified example, an application example, a detailed explanation, a supplemental explanation, or the like of apart or all of the other, unless otherwise specified. Further, in the following embodiments, when a number of an element (including a number of items, numerical value, quantity, range, etc.) or the like is mentioned, the number is not limited to that specific number, and may be larger or smaller than the mentioned number, except for the case where it is explicitly indicated that the number should be the specifically-mentioned number or it is theoretically clear that the number should be limited to the specifically-mentioned number.

Further, in the following embodiments, the constituent elements thereof (including operation steps etc.) are not necessarily indispensable, except for the case where it is explicitly indicated that a specific element is indispensable, or it is theoretically clear that a specific element is indispensable. Similarly, in the following embodiments, when shapes, positional relationships, etc. of the constituent elements are mentioned, they include substantially similar or analogous shapes and so forth, except for the case where it is explicitly indicated, or it is theoretically clear that the above is not true. This also applies to the above-mentioned values (including a number of items, numerical value, quantity, range, etc.) and the like.

First Embodiment

FIG. 1 is a block diagram showing a configuration example of a semiconductor storage device 1 according to a first embodiment. FIG. 1 shows only circuits involved in data reading.

The semiconductor storage device 1 shown in FIG. 1 includes memory cell arrays 11 and 12, a data output unit 13, a control circuit 14, and word line drivers 15 and 16.

The memory cell array 11 includes a plurality of memory cells (first memory cells) MC (hereinafter referred to also as memory cells UMC) which are arranged in a matrix of m rows×n columns (m and n are natural numbers). Similarly, the memory cell array 12 includes a plurality of memory cells (second memory cells) MC (hereinafter referred to also as memory cells LMC) which are arranged in a matrix of m rows×n columns. That is, in the semiconductor storage device 1, a plurality of memory cells MC arranged in a matrix of 2m rows×n columns are provided in the two memory cell arrays 11 and 12 in a separate manner.

The m rows of the plurality of memory cells UMC are respectively provided with word lines (first word lines) UWL1 to UWLm. The n columns of the plurality of memory cells UMC are respectively provided with bit lines (first bit lines) UBL1 to UBLn.

The m rows of the plurality of memory cells LMC are respectively provided with word lines (second word lines) LWL1 to LWLm. The n columns of the plurality of memory cells LMC are respectively provided with bit lines (second bit lines) LBL1 to LBLn.

Note that data is read out from each memory cell MC by using single-ended bit lines. Accordingly, each memory cell MC is electrically connected to only one bit line when stored data is read out.

Specific configuration examples of each memory cell MC will be described below. Note that a specific configuration example of the memory cell MC located in the first row and the first column of the memory cell array 11 will be described as a typical example.

(First Specific Configuration Example of Memory Cell MC)

Figure 2:
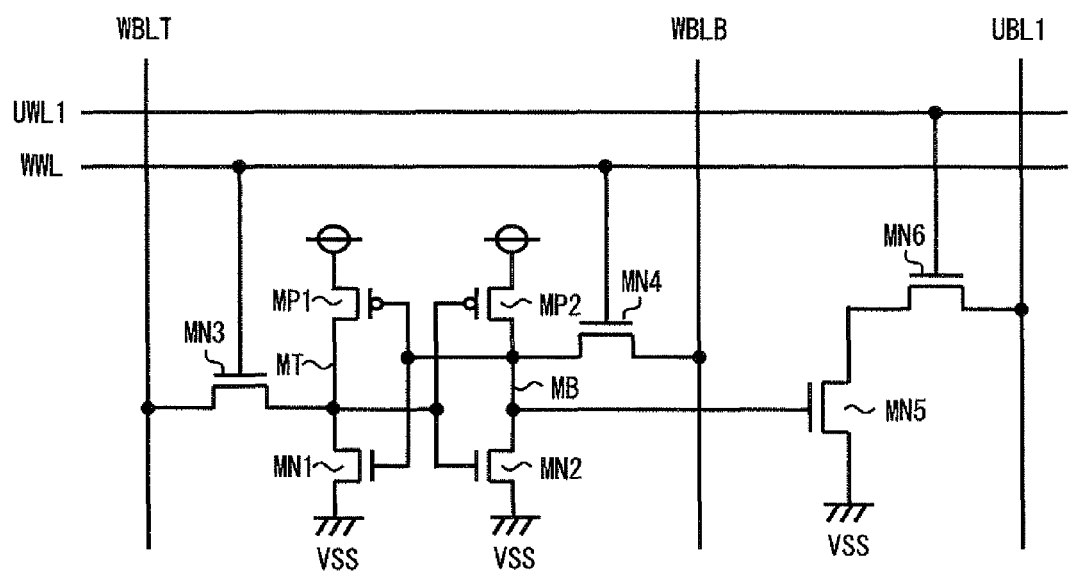
FIG. 2 is a circuit diagram showing a first specific configuration example of a memory cell provided in the semiconductor storage device according to the first embodiment.

FIG. 2 is a circuit diagram showing a first specific configuration example of the memory cell MC. The memory cell MC shown in FIG. 2 is an SRAM memory cell, and includes transistors MP1 and MP2 which are PMOS transistors, and transistors MN1 to MN6 which are NMOS transistors.

The transistors MP1 and MN1 constitute a first inverter. The transistors MP2 and MN2 constitute a second inverter. The second inverter inverts a voltage level (H level or L level) of an output (storage node MT) of the first inverter, and outputs the inverted output to an input (storage node MB) of the first inverter. Thus, data is stored.

The transistor MN3 is provided between the storage node MT and a data write bit line WBLT, which is one of a data write bit line pair, and turning on and off of the transistor MN 3 is controlled according to a potential of a data write word line WWL. The transistor MN4 is provided between the storage node MB and a data write bit line WBLB, which is the other of the data write bit line pair, and turning on and off of the transistor MN4 is controlled according to the potential of the data write word line WWL. During data writing, when the transistors MN3 and MN4 turn on, the potential (write data) of the pair of data write bit lines WBLT and WBLB is transmitted to the storage nodes MT and MB, so that data is written into the storage nodes MT and MB.

The transistor (first MOS transistor) MN5 is provided between the data read bit line UBL1 and a ground voltage terminal (hereinafter referred to as a ground voltage terminal VSS) which is supplied with a ground voltage VSS, and turning on and off of the transistor MN5 is controlled according to the potential of the storage node MB. The transistor (second MOS transistor) MN6 is provided in series with the transistor MN5, and turning on and off of the transistor MN6 is controlled according to the potential of the word line UWL1.

For example, when the word line UWL1 has a low potential (L level) (that is, when the word line UWL1 is not activated), the transistor MN6 turns off. Accordingly, the bit line UBL1 maintains a high potential, regardless of the potential of the storage node MB. On the other hand, when the word line UWL1 has a high potential (H level) (that is, when the word line UWL1 is activated), the transistor MN6 turns on. In this case, when the storage node MB has a high potential (H level), the transistor MN5 turns on, so that a current flows from the bit line UBL1 toward the ground voltage terminal VSS through the transistors MN5 and MN6. As a result, the potential of the bit line UBL1 is lowered. On the other hand, when the storage node MB has a low potential (L level), the transistor MN5 turns off, so that no current flows from the bit line UBL1 toward the ground voltage terminal VSS through the transistors MN5 and MN6. Accordingly, the high potential of the bit line UBL1 is maintained. Then the read data corresponding to the potential of the bit line UBL1 is read out.

(Second Specific Configuration Example of Memory Cell MC)

Figure 3:
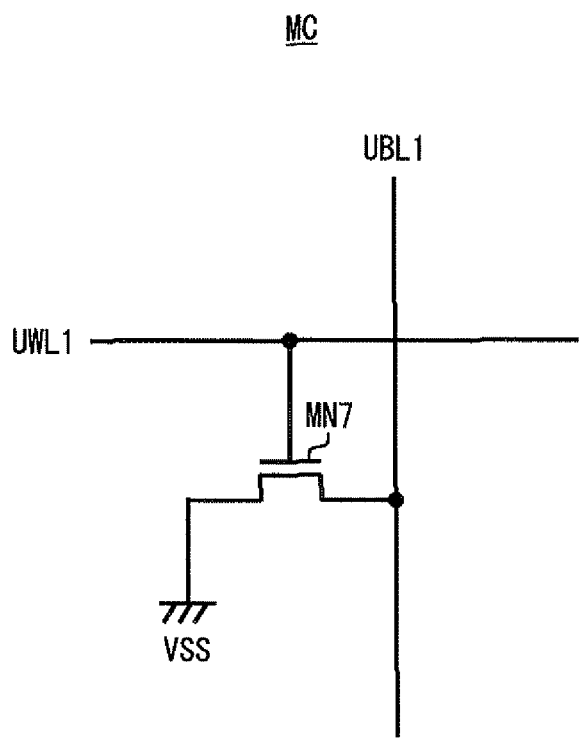
FIG. 3 is a circuit diagram showing a second specific configuration example of a memory cell provided in the semiconductor storage device according to the first embodiment.

FIG. 3 is a circuit diagram showing a second specific configuration example of the memory cell MC. The memory cell MC shown in FIG. 3 is a memory cell for ROM and includes a transistor MN7 which is an NMOS transistor.

The transistor MN7 is provided between the bit line UBL1 and the ground voltage terminal VSS, and turning on and off of the transistor MN7 is controlled according the potential of the word line UWL1.

For example, when the word line UWL1 has a low potential (L level), the transistor MN7 turns off. Accordingly, the high potential of the bit line UBL1 is maintained. On the other hand, when the word line UWL1 has a high potential (H level), the transistor MN7 turns on. Thus, since the ground voltage terminal VSS and the bit line UBL1 are electrically connected to each other, the potential of the bit line UBL1 decreases. Then the read data indicative of the value corresponding to the potential of the bit line UBL1 is read out.

Returning to FIG. 1, the word line driver 15 activates any of the word lines UWL1 to UWLm during data reading. The word line driver 16 activates any of the word lines LWL1 to LWLm during data read. The word line drivers 15 and 16 activate only one of the 2m word lines UWL1 to UWLm and LWL1 to LWLm during data reading.

During data reading, the data output unit 13 amplifies a potential difference between a reference potential Vref and a potential of a bit line connected to a data read target memory cell MC among the bit lines UBL1 to UBLn and LBL1 to LBLn, and outputs the amplified potential difference as read data Q.

The control circuit 14 generates a sense amplifier enable signal SAE, array selection signals UY and LY, a potential of a dummy word line, and control signals Y1 to Yn, for example, and controls the data output unit 13.

(A Configuration Example of the Data Output Unit 13)

Figure 4:
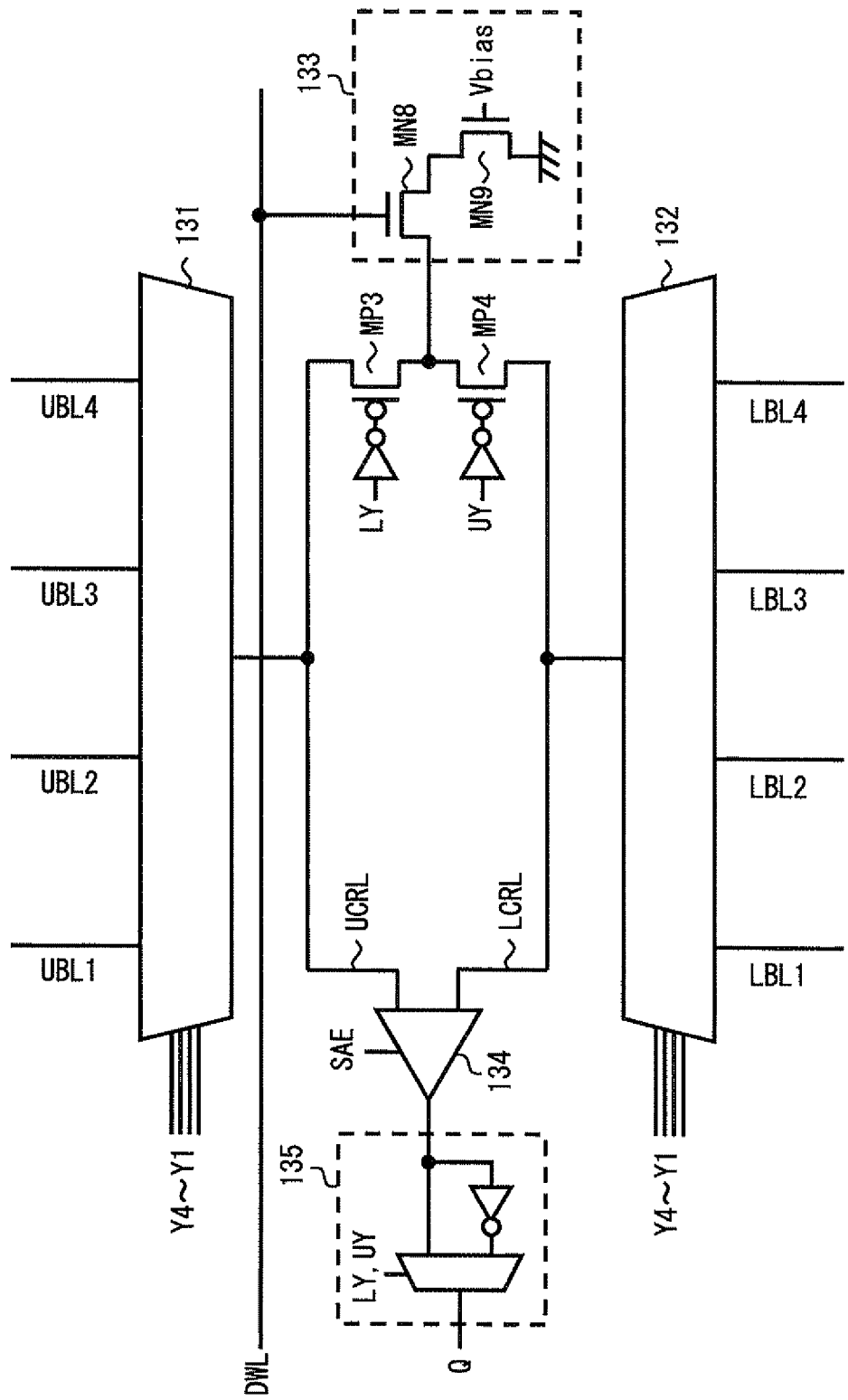
FIG. 4 is a block diagram showing a configuration example of a data output unit provided in the semiconductor storage device according to the first embodiment.

FIG. 4 is a block diagram showing a configuration example of the data output unit 13. The data output unit 13 shown in FIG. 4 includes a selection circuit (first selection circuit) 131, a selection circuit (second selection circuit) 132, a common bit line (first common bit line) UCRL, a common bit line (second common bit line) LCRL, a dummy word line DWL, PMOS transistors MP3 and MP4, a reference current generation unit 133, a sense amplifier 134, and an output switching circuit 135. The transistors MP3 and MP4 and the reference current generation unit 133 constitute a reference current supply unit.

The selection circuit 131 connects the common bit line UCRL to a bit line selected from among the bit lines UBL1 to UBLn based on the control signals Y1 to Yn. The selection circuit 132 connects the common bit line LCRL to a bit line selected from among the bit lines LBL1 to LBLn based on the control signals Y1 to Yn.

For example, when the memory cell MC located in the first row and the first column of the memory cell array 11 is a data read target memory cell, the selection circuit 131 connects the bit line UBL1 and the common bit line UCRL to each other. At this time, the selection circuit 132 connects the bit line LBL1 and the common bit line LCRL to each other.

When the dummy word line DWL is activated in response to the activation of any word line, the reference current generation unit 133 generates a reference current Iref. More preferably, when the dummy word line DWL is activated at substantially the same time as the activation of any word line, the reference current generation unit 133 generates the reference current Iref.

The reference current generation unit 133 includes, for example, NMOS transistors MN8 and MN9. The transistor MN8 is provided between an output terminal of the reference current generation unit 133 and the ground voltage terminal VSS, and turning on and off of the transistor MN8 is controlled according to the potential of the dummy word line DWL. The transistor MN9 is provided in series with the transistor MN8, and an on-resistance of the transistor MN9 is controlled according to a bias voltage Vbias.

Assuming that a current flowing through a common bit line in the state of being electrically connected to the memory cell MC in which data "0" is stored is represented by Izero and a current flowing through a common bit line in the state of being electrically connected to the memory cell MC in which data "1" is stored is represented by Ione, the relationship among the currents Iref, Izero, and Ione is expressed as, for example, Izero>Iref>Ione.

The transistor MP3 is provided between the common bit line UCRL and the reference current generation unit 133, and turning on and off of the transistor MP3 is controlled according to the array selection signal (determination signal) LY. When the data read target memory cell MC belongs to the memory cell array 12, the array selection signal LY indicates the H level. Otherwise, the array selection signal LY indicates the L level.

The transistor MP4 is provided between the common bit line LCRL and the reference current generation unit 133, and turning on and off of the transistor MP4 is controlled according to the array selection signal (determination signal) UY. When the data read target memory cell MC belongs to the memory cell array 11, the array selection signal UY indicates the H level. Otherwise, the array selection signal UY indicates the L level.

Accordingly, a common bit line, which is not electrically connected to the data read target memory cell MC, among the common bit lines UCRL and LCRL, is connected to the reference current generation unit 133.

For example, when the memory cell MC located in the first row and the first column of the memory cell array 11 is the data read target memory cell, the data read target memory cell MC and the common bit line UCRL are electrically connected to each other. Accordingly, the reference current generation unit 133 and the common bit line LCRL, which is not electrically connected to the data read target memory cell MC, are connected to each other.

In other words, when the dummy word line DWL is activated in response to the activation of any word line, the reference current supply unit, which includes the reference current generation unit 133 and the transistors MP3 and MP4, supplies the reference current Iref to a common bit line, which is not electrically connected to the data read target memory cell MC, among the common bit lines UCRL and LCRL. Note that the configuration of the reference current supply unit is not limited to the configuration described above, and can be appropriately changed to another configuration having equivalent functions.

When the sense amplifier enable signal SAE is activated, the sense amplifier 134 amplifies a potential difference between the common bit lines UCRL and LCRL. More specifically, when the sense amplifier enable signal SAE is activated, the sense amplifier 134 amplifies the potential difference between the potential of the common bit line (for example, UCRL) which is in the state of being electrically connected to the data read target memory cell MC and the potential Vref of the common bit line (for example, LCRL) which is supplied with the reference current Iref.

The output switching circuit 135 selectively outputs, as the read data Q, one of an output signal of the sense amplifier 134 and an inverted signal of the output signal, according to the attribute of the data read target memory cell MC. More specifically, when the data read target memory cell MC belongs to the memory cell array 11, the output switching circuit 135 outputs the output signal of the sense amplifier 134 as the read data Q, and when the data read target memory cell MC belongs to the memory cell array 12, the output switching circuit 135 outputs the inverted signal of the output signal of the sense amplifier 134 as the read data Q.

(A Specific Configuration Example of the Data Output Unit 13)

Figure 5:
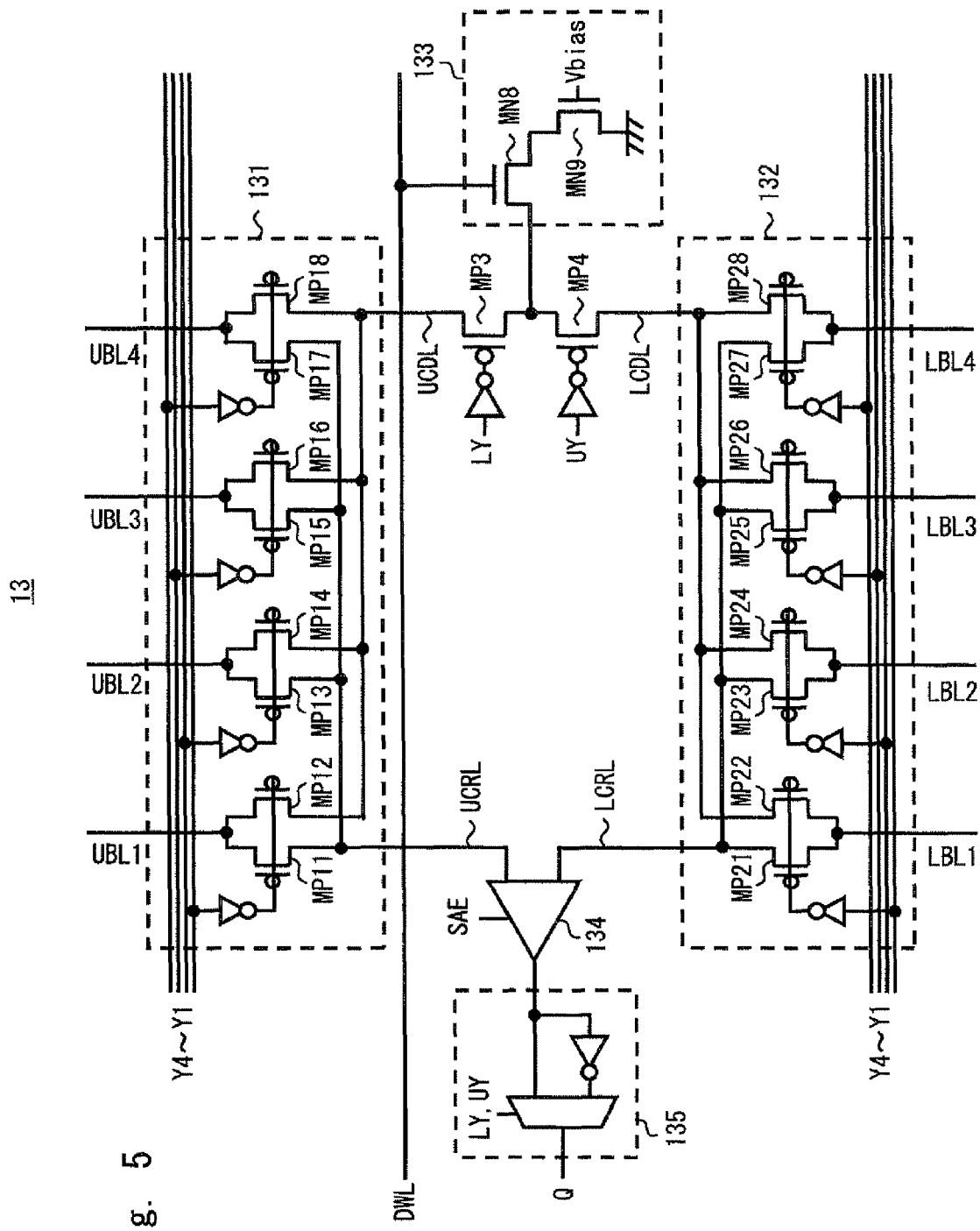
FIG. 5 is a diagram showing a specific configuration example of the data output unit provided in the semiconductor storage device according to the first embodiment.

FIG. 5 is a diagram showing a specific configuration example of the data output unit 13. The data output unit 13 shown in FIG. 5 includes PMOS transistors MP11 to MP18 each serving as the selection circuit 131, and PMOS transistors MP21 to MP28 each serving as the selection circuit 132.

The transistor MP11 is provided between the bit line UBL1 and the common bit line UCRL, and turning on and off of the transistor MP11 is controlled according to the inverted signal of the control signal Y1. The transistor MP12 is provided between the bit line UBL1 and a node UCDL, and turning on and off of the transistor MP12 is controlled according to the control signal Y1. The transistor MP13 is provided between the bit line UBL2 and the common bit line UCRL, and turning on and off of the transistor MP13 is controlled according to the inverted signal of the control signal Y2. The transistor MP14 is provided between the bit line UBL2 and the node UCDL, and turning on and off of the transistor MP14 is controlled according to the control signal Y2. The transistor MP15 is provided between the bit line UBL3 and the common bit line UCRL, and turning on and off of the transistor MP15 is controlled according to the inverted signal of the control signal Y3. The transistor MP16 is provided between the bit line UBL3 and the node UCDL, and turning on and off of the transistor MP16 is controlled according to the control signal Y3. The transistor MP17 is provided between the bit line UBL4 and the common bit line UCRL, and turning on and off of the transistor MP17 is controlled according to the inverted signal of the control signal Y4. The transistor MP18 is provided between the bit line UBL4 and the node UCDL, and turning on and off of the transistor MP18 is controlled according to the control signal Y4.

The transistor MP21 is provided between the bit line LBL1 and the common bit line LCRL, and turning on and off of the transistor MP21 is controlled according to the inverted signal of the control signal Y1. The transistor MP22 is provided between the bit line LBL1 and a node LCDL, and turning on and off of the transistor MP22 is controlled according to the control signal Y1. The transistor MP23 is provided between the bit line LBL2 and the common bit line LCRL, and turning on and off of the transistor MP23 is controlled according to the inverted signal of the control signal Y2. The transistor MP24 is provided between the bit line LBL2 and the node LCDL, and turning on and off of the transistor MP24 is controlled according to the control signal Y2. The transistor MP25 is provided between the bit line LBL3 and the common bit line LCRL, and turning on and off of the transistor MP25 is controlled according to the inverted signal of the control signal Y3. The transistor MP26 is provided between the bit line LBL3 and the node LCDL, and turning on and off of the transistor MP26 is controlled according to the control signal Y3. The transistor MP27 is provided between the bit line LBL4 and the common bit line LCRL, and turning on and off of the transistor MP27 is controlled according to the inverted signal of the control signal Y4. The transistor MP28 is provided between the bit line LBL4 and the node LCDL, and turning on and off of the transistor MP28 is controlled according to the control signal Y4.

(Operation of the Semiconductor Storage Device 1)

Figure 6:
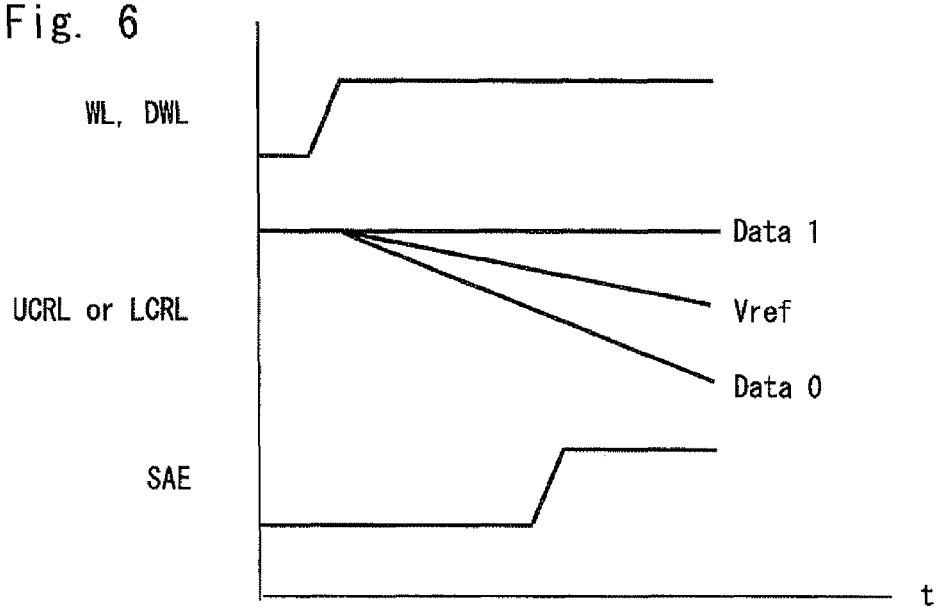
FIG. 6 is a timing diagram showing a part of an operation of the semiconductor storage device according to the first embodiment.

Next, a data read operation of the semiconductor storage device 1 will be described with reference to FIG. 6. FIG. 6 is a timing diagram showing a part of the operation of the semiconductor storage device 1. The case where the memory cell MC located in the first row and the first column of the memory cell array 11 is the data read target memory cell will be described below by way of example.

First, a bit line is selected. In this example, the selection circuit 131 connects the bit line UBL1 and the common bit line UCRL to each other based on the control signals Y1 to Yn, and the selection circuit 132 connects the bit line LBL1 and the common bit line LCRL to each other based on the control signals Y1 to Yn. At this time, based on the array selection signals UY and LY, the common bit line LCRL, which is not electrically connected to the data read target memory cell MC, and the reference current generation unit 133 are connected to each other.

Next, a word line is selected. In this example, the word line driver 15 activates the word line UWL1. As a result, a plurality of memory cells MC in the first row, which are provided in the memory cell array 11, and the bit lines UBL1 to UBLn, which respectively correspond to the memory cells MC, are connected to each other. At this time, the word line driver 16 does not activate any of the word lines LWL1 to LWLm.

Thus, a current corresponding to data stored in the data read target memory cell MC flows through the common bit line UCRL. For example, when data "1" is stored in the data read target memory cell MC, almost no current flows through the common bit line UCRL. Accordingly, the potential of the common bit line UCRL is maintained at a high potential (about VDD). On the other hand, when data "0" is stored in the data read target memory cell MC, the current Izero flows through the common bit line UCRL, so that the potential of the common bit line UCRL decreases.

Further, the dummy word line DWL is activated in response to the activation of the word line UWL1. More preferably, the dummy word line DWL is activated at substantially the same time as the activation of the word line UWL1. Accordingly, since the reference current Iref flows through the common bit line LCRL which is not electrically connected to the data read target memory cell MC, so that the potential of the common bit line LCRL decreases more gradually than the case where the current Izero flows.

Next, when the sense amplifier enable signal SAE is activated, the sense amplifier 134 amplifies the potential difference between the common bit lines UCRL and LCRL. More specifically, when the sense amplifier enable signal SAE is activated, the sense amplifier 134 amplifies the potential difference between the potential of the common bit line UCRL in the state of being electrically connected to the data read target memory cell MC and the potential Vref of the common bit line LCRL which is supplied with the reference current Iref. After that, the output of the sense amplifier 134 is output as the read data Q to the outside through the output switching circuit 135.

As described above, unlike the related art, the semiconductor storage device 1 according to the first embodiment eliminates the need for a dummy bit line, thereby suppressing an increase in circuit size. Moreover, the semiconductor storage device 1 according to the first embodiment supplies the reference potential Vref to the sense amplifier 134 by using a normal bit line, which is not used temporarily, instead of a dummy bit line. Therefore, deterioration of a read margin due to production variations can be suppressed.

Second Embodiment

Figure 7:
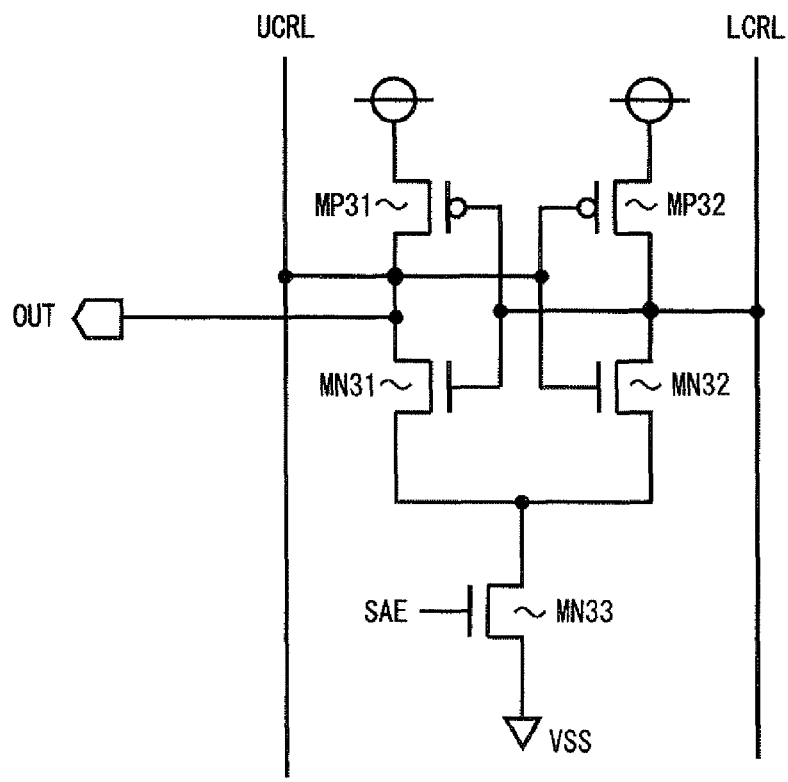
FIG. 7 is a diagram showing a specific configuration example of a sense amplifier provided in a semiconductor storage device according to a second embodiment.

In a second embodiment, a specific configuration example of the sense amplifier 134 will be described. FIG. 7 is a circuit diagram showing a specific configuration example of the sense amplifier 134.

The sense amplifier 134 shown in FIG. 7 includes PMOS transistors MP31 and MP32 and NMOS transistors MN31 and MN32. The transistors MP31 and MN31 constitute a first inverter. The transistors MN32 and MN32 constitute a second inverter. The second inverter inverts a voltage level (H level or L level) of an output of the first inverter, and outputs the inverted output to an input of the first inverter. The common bit line UCRL and the output of the first inverter are connected to each other. The common bit line LCRL and the output of the second inverter are connected to each other. On the grand voltage terminal VSS side of each of the first and second inverters, a transistor MN33 is provided. Turning on and off of the transistor MN33 is controlled according to the sense amplifier enable signal SAE.

In general, the potential of the common bit line in the state of being electrically connected to the memory cell MC in which data "1" is stored needs to indicate a high potential (about VDD), but the potential may gradually decrease due to an unintended discharge (leak current). However, the sense amplifier 134 shown in FIG. 7 has a circuit configuration in which the drain of a transistor receives a signal, which makes it possible to maintain the potential of the common bit line at a high potential by a self-amplification operation. Therefore, it is not necessary for the semiconductor storage device 1 according to the second embodiment to be provided with a keeper circuit for maintaining the potential with respect to each bit line. Specific examples thereof will be described below.

The case where the memory cell MC located in the first row and the first column of the memory cell array 11 is the data read target memory cell will be described below by way of example. Further, the case where data "1" is stored in the data read target memory cell MC will be described below.

First, the potential of the common bit line UCRL in the state of being electrically connected to the data read target memory cell MC in which data "1" is stored gradually decreases from the high potential due to a leak current. On the other hand, the potential of the common bit line LCRL, which is not electrically connected to the data read target memory cell MC, decreases more rapidly than the potential of the common bit line UCRL due to the reference current Iref. Accordingly, the transistor MP31 turns on before the transistor MN32 turns on. As a result, the common bit line UCRL is supplied with the power supply voltage VDD through the transistor MP31. Thus, the potential of the common bit line UCRL is maintained at a high potential.

Third Embodiment

Figure 8:
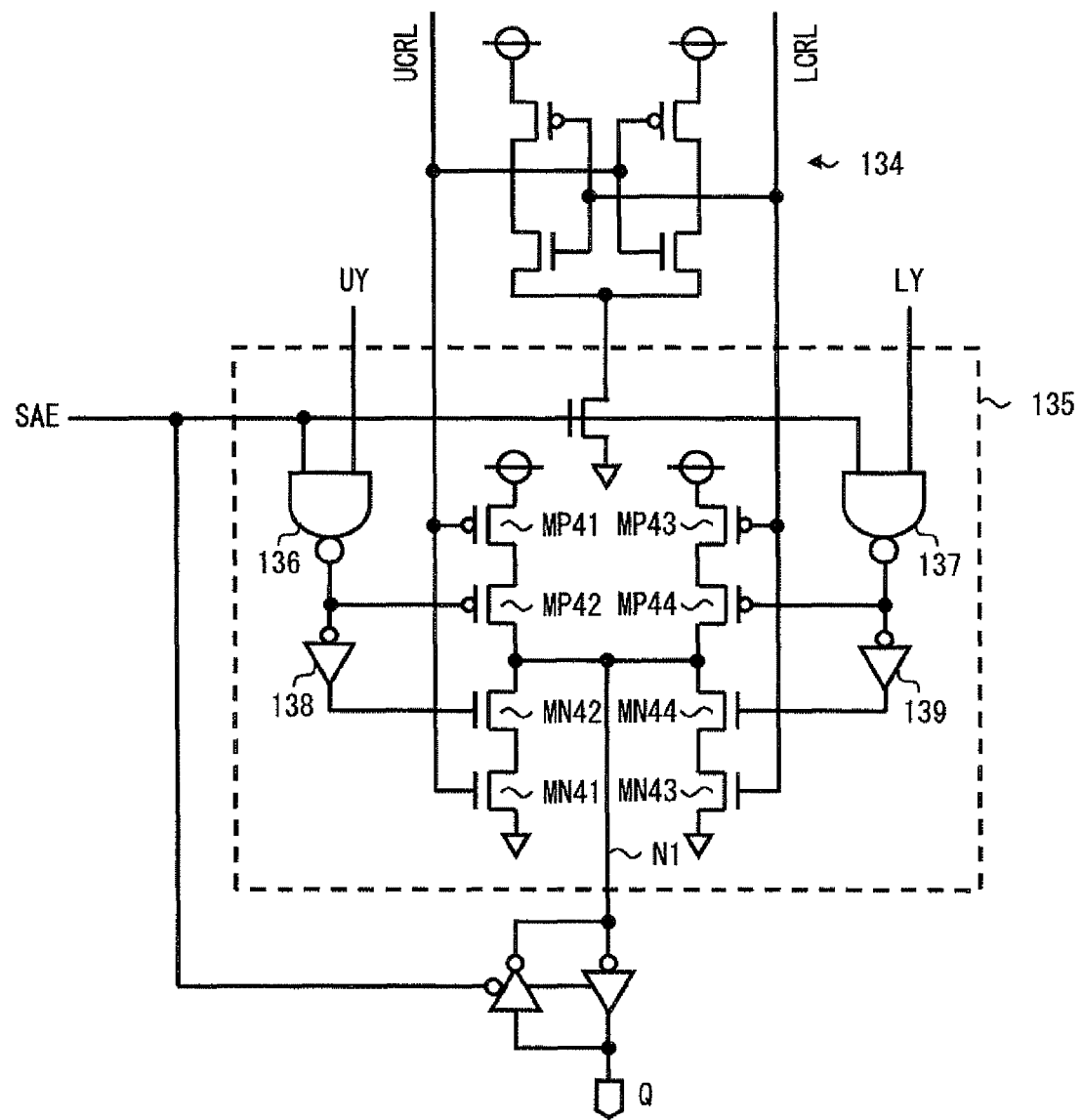
FIG. 8 is a circuit diagram showing a specific configuration example of an output switching circuit provided in a semiconductor storage device according to a third embodiment.

In a third embodiment, a specific configuration example of the output switching circuit 135 will be described. FIG. 8 is a circuit diagram showing a specific configuration example of the output switching circuit 135. FIG. 8 also shows the sense amplifier 134.

The output switching circuit 135 shown in FIG. 8 includes PMOS transistors MP41 to MP44, NMOS transistors MN41 to MN44, NAND circuits 136 and 137, and inverters 138 and 139.

The NAND circuit 136 outputs a NAND between the sense amplifier enable signal SAE and the array selection signal UY. The inverter 138 inverts the output signal of the NAND circuit 136 and outputs the inverted signal. The NAND circuit 137 outputs a NAND between the sense amplifier enable signal SAE and the array selection signal LY. The inverter 139 inverts the output signal of the NAND circuit 137 and outputs the inverted signal.

The transistor MP41 has a source connected to the power supply voltage terminal VDD, and a gate connected to the common bit line UCRL. The transistor MP42 has a source connected to a drain of the transistor MP41, a drain connected to an output node N1, and a gate supplied with the output signal of the NAND circuit 136. The transistor MN41 has a source connected to the ground voltage terminal VSS, and a gate connected to the common bit line UCRL. The transistor MN42 has a source connected to a drain of the transistor MN41, a drain connected to the output node N1, and a gate supplied with the output signal of the inverter 138.

The transistor MP43 has a source connected to the power supply voltage terminal VDD, and a gate connected to the common bit line LCRL. The transistor MP44 has a source connected to the drain of the transistor MP43, and a drain connected to the output node N1. The gate of the transistor MP44 is supplied with an output signal from the NAND circuit 137. The transistor MN43 has a source connected to the ground voltage terminal VSS, and a gate connected to the common bit line LCRL. The transistor MN44 has a source connected to a drain of the transistor MN43, a drain connected to the output node N1, and a gate supplied with the output signal of the inverter 139.

The output switching circuit 135 shown in FIG. 8 has a layout in which circuits located on the side of the common bit line UCRL and circuits located on the side of the common bit line LCRL are arranged in a symmetrical fashion. This layout allows the output switching circuit 135 shown in FIG. 8 to set substantially the same sense margin or access speed, even when the data read target memory cell belongs to any of the memory cell arrays 11 and 12.

Fourth Embodiment

Figure 9:
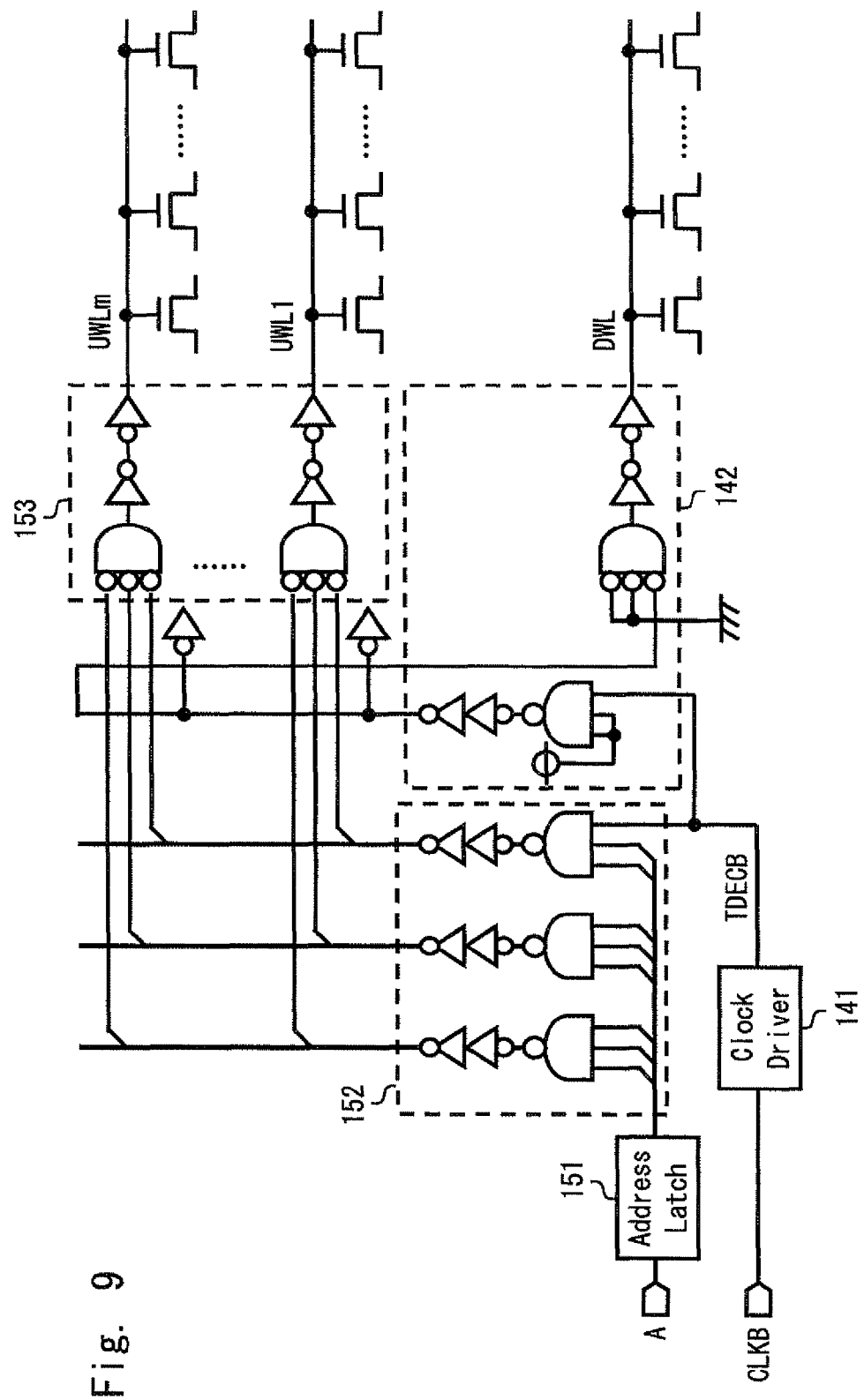
FIG. 9 is a diagram showing a specific configuration example of a part of each of a control unit and a word line driver which are provided in a semiconductor storage device according to a fourth embodiment.

In a fourth embodiment, a configuration in the vicinity of each word line and each dummy word line will be described. FIG. 9 is a diagram showing a specific configuration example of a part of each of the control circuit 14 and the word line driver 15.

As shown in FIG. 9, the word line driver 15 includes at least an address latch 151, an address pre-decoder 152, and a word decoder 153. The control circuit 14 includes at least a clock driver 141 and a dummy word line driver 142.

The address latch 151 latches an address signal A. The clock driver 141 drives a clock signal CLKB and outputs a clock signal TDECB. The address pre-decoder 152 pre-decodes the address signal A which is latched by the address latch 151. The word decoder 153 selects any one of the word lines WL1 to WLm based on a pre-decoding result obtained by the address pre-decoder 152, and activates the selected word line during a period in which the clock signal TDECB is active.

Similarly, the dummy word line driver 142 activates the dummy word line DWL during the period in which the clock signal TDECB is active. In this case, the dummy word line DWL is preferably activated at the same timing as that of the word line. Accordingly, in the example shown in FIG. 9, each circuit that supplies a potential to the corresponding word line and a circuit that supplies a potential to the dummy word line DWL are configured in the same manner. Specifically, the number of logic stages, load capacity, transistor size, threshold voltage, and the like of each circuit that supplies a potential to the corresponding one of the word lines are set to be equal to those of the circuit that supplies a potential to the dummy word line DWL. Further, the total channel area of the MOS transistors connected to the corresponding one of the word lines is set to be equal to the total channel area of the MOS transistors connected to the dummy word line DWL. Furthermore, the line length and line width of each word line are set to be equal to the line length and line width of the dummy word line. Moreover, line intervals between the plurality of word lines and the dummy word line are set to be equal to each other. With this configuration, the semiconductor storage device 1 according to the fourth embodiment can set the activation timing of each word line and the activation timing of the dummy word line to be close to each other, thereby making it possible to read data with a high accuracy.

Fifth Embodiment

A semiconductor storage device 2 according to a fifth embodiment further includes, as compared with the semiconductor storage device 1, a test function. The semiconductor storage device 2 according to the fifth embodiment is a 2-port SRAM including a write-only port and a read-only port. The memory cell MC shown in FIG. 2 is used for each memory cell MC.

Figure 13:
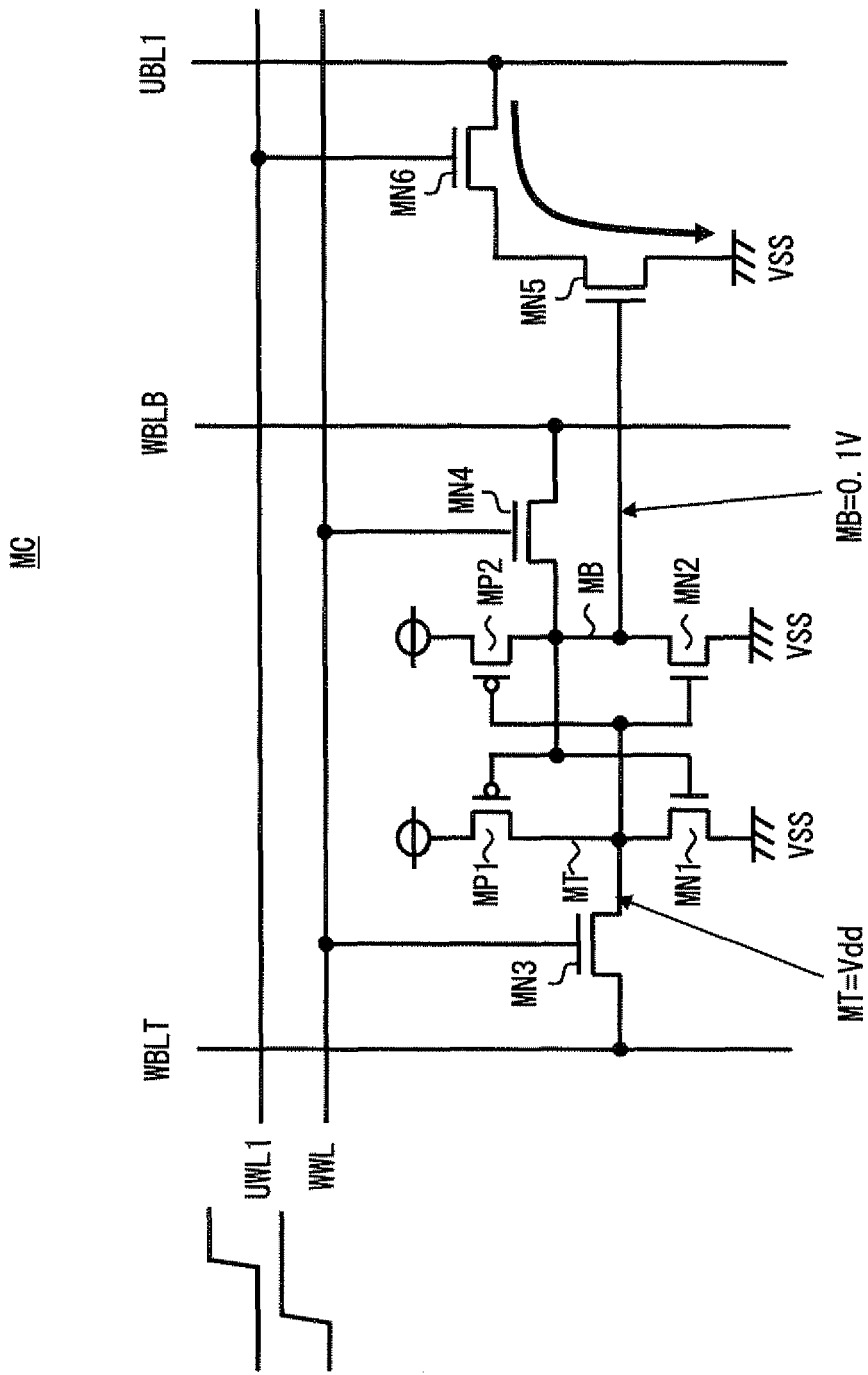
FIG. 13 is a circuit diagram for explaining a problem inherent in a 2-port SRAM.
Figure 14:
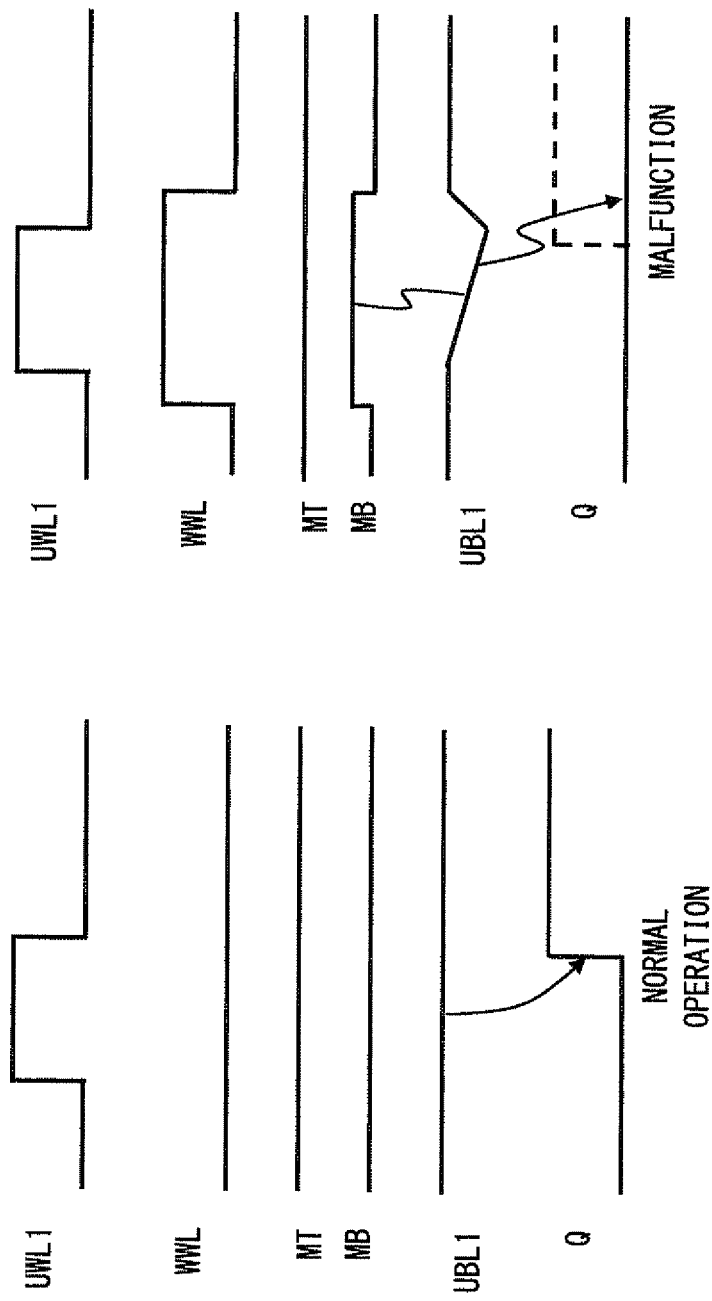
FIG. 14 is a timing diagram for explaining the problem inherent in the 2-port SRAM.

First, a problem inherent in the 2-port SRAM will be briefly described. FIG. 13 is a circuit diagram for explaining the problem inherent in the 2-port SRAM. FIG. 14 is a timing diagram for explaining the problem inherent in the 2-port SRAM. The case where the memory cell MC located in the first row and the first column of the memory cell array 11 is the data read target memory cell will be described below by way of example. Also, the case where data "1" is stored in the data read target memory cell MC will be described below by way of example.

First, as shown in the left part of FIG. 14, in a normal data read operation, when the word line UWL1 is activated, the potential of the bit line UBL1 (common bit line UCRL) which is in the state of being electrically connected to the data read target memory cell MC is maintained at a high potential (about VDD). As a result, the read data Q indicative of the H level representing the data "1" is output.

Next, as shown in the right part of FIG. 14, when a data read operation for the data read target memory cell MC and a data write operation for another memory cell MC in the same row are performed in parallel, the read word line UWL1 may be activated immediately after the write word line WWL is activated. In this case, in the data read target memory cell MC, the activation of the word line WWL causes the transistors MN3 and MN4 to turn on, so that the potential of each of the storage nodes MT and MB slightly fluctuates. In the example of FIG. 13, the potential of the storage node MB fluctuates from 0 V to about 0.1 V. When the word line UWL1 is activated in this state, a leak current flows through the transistors MN5 and MN6. Accordingly, the potential of the bit line UBL1 (common bit line UCRL) slightly decreases from the high potential (about VDD). When the potential of the bit line UBL1 is greatly lowered, the read data Q indicative of the L level representing the data "0" is unintentionally output.

As described above, the 2-port SRAM has a problem that when different memory cells MC in the same row are accessed by the write-only port and the read-only port at the same time, the read margin deteriorates and a failure occurs. It is difficult to find a read failure during a shipping test.

In this regard, the semiconductor storage device 2 according to the fifth embodiment intentionally creates a state in which the word line UWL1 is activated immediately after the word line WWL is activated, thereby making it possible to conduct a test to determine whether data can be correctly read out when different memory cells MC in the same row are accessed by the write-only port and the read-only port at the same time.

Figure 10:
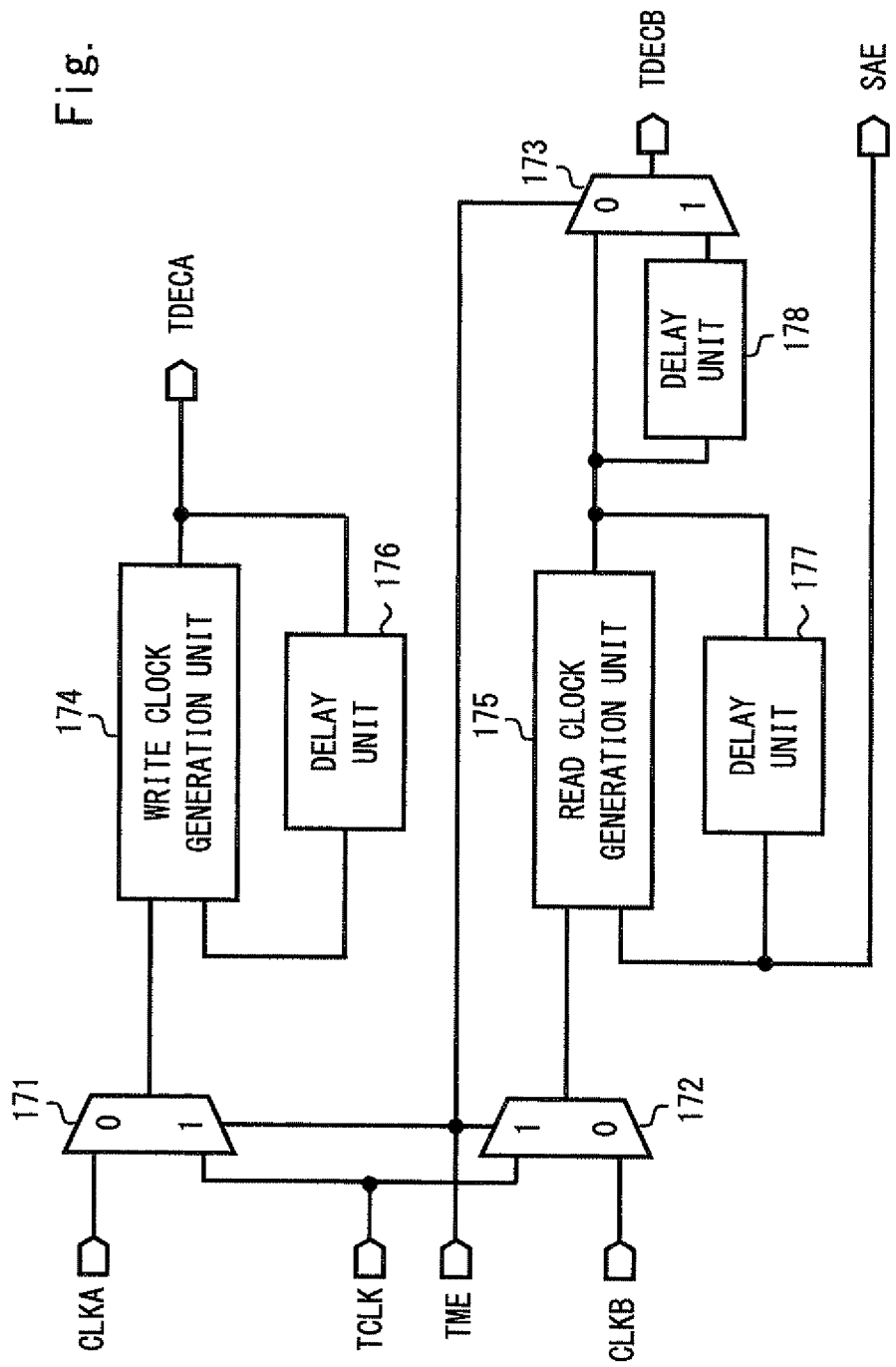
FIG. 10 is a block diagram showing a configuration example of a clock generation unit provided in a semiconductor storage device according to a fifth embodiment.
Figure 11:
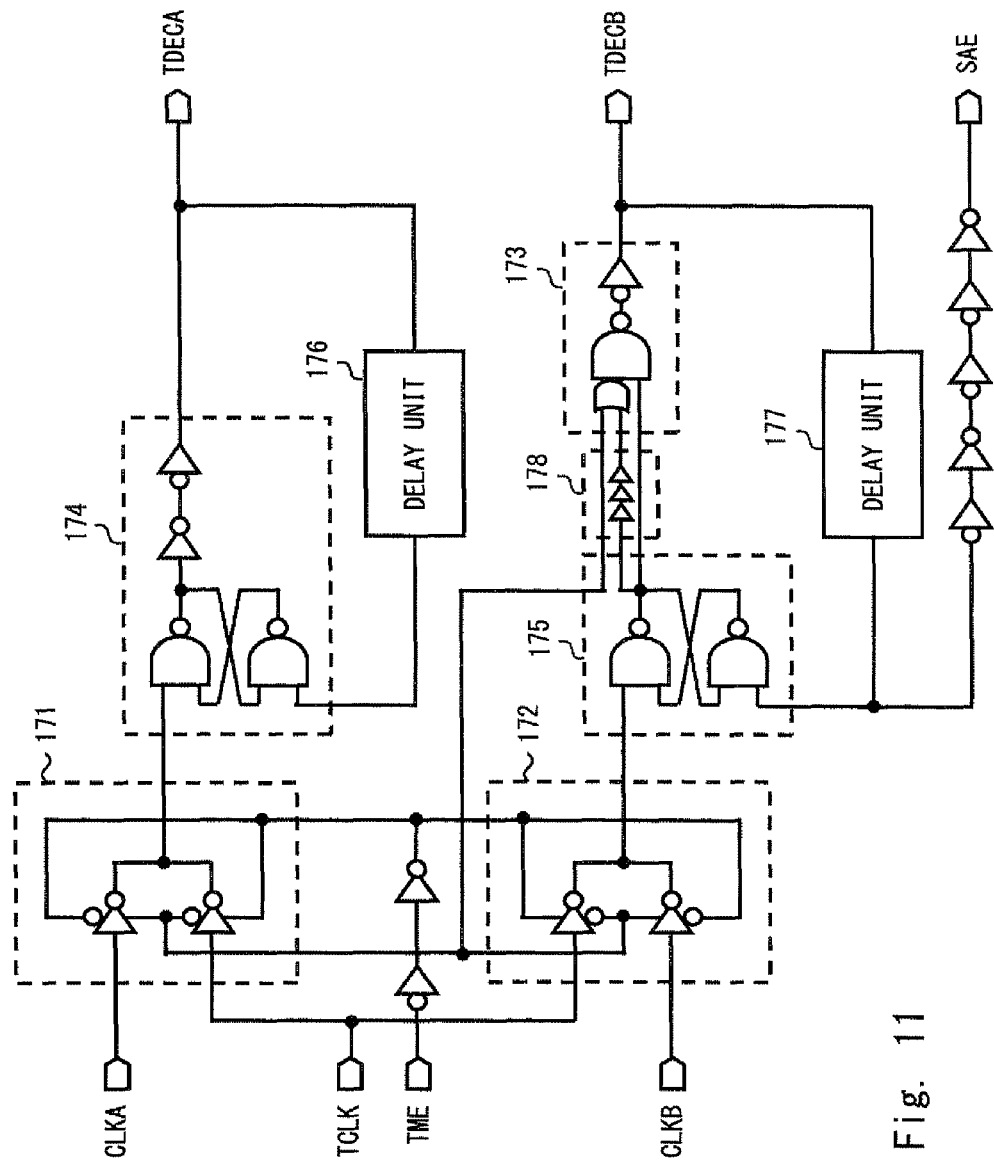
FIG. 11 is a diagram showing a specific configuration example of the clock generation unit provided in the semiconductor storage device according to the fifth embodiment.

FIG. 10 is a block diagram showing a configuration example of a clock generation unit (test control circuit) 17 which is provided in the semiconductor storage device 2. FIG. 11 is a diagram specifically showing the clock generation unit 17 shown in FIG. 10. The clock generation unit 17 shown in FIG. 10 includes selectors 171 to 173, a write clock generation unit 174, a read clock generation unit 175, and delay units 176 to 178.

The selector 171 selects one of a write clock signal CLKA and a test clock signal TCLK based on a test enable signal TME, and outputs the selected signal. The write clock generation unit 174 causes a clock signal TDECA to rise in synchronization with a rising edge of the clock signal selected by the selector 171. After a lapse of a delay time by the delay unit 176, the write clock generation unit 174 causes the clock signal TEDCA to fall. The write word line WWL is activated during a period in which the clock signal TDECA is active.

The selector 172 selects one of the reading clock signal CLKB and the test clock signal TCLK based on the test enable signal TME, and outputs the selected signal. The read clock generation unit 175 causes the clock signal TDECB to rise in synchronization with a rising edge of the clock signal selected by the selector 172. After a lapse of a delay time by the delay unit 177, the read clock generation unit 175 causes the clock signal TDECB to fall. The selector 173 selects one of the clock signal TDECB and the signal obtained by delaying the clock signal TDECB by the delay unit 178, based on the test enable signal TME, and outputs the selected signal. The read word line UWL1 is activated during a period in which the clock signal TDECB or the delayed signal is active.

(Operation of the Semiconductor Storage Device 2)

Figure 12:
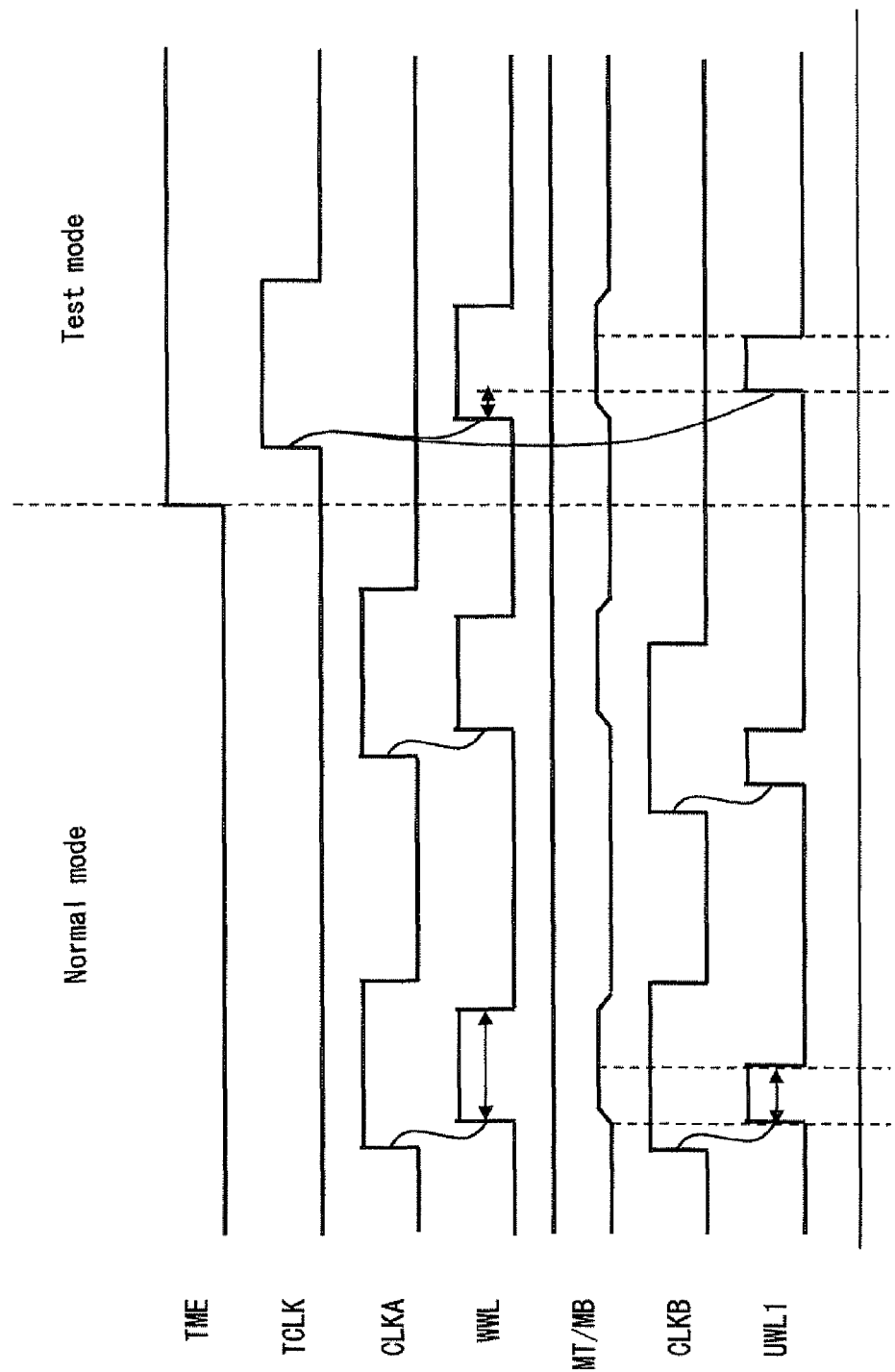
FIG. 12 is a timing diagram showing an operation of the semiconductor storage device according to the fifth embodiment.

Next, an operation of the semiconductor storage device 2 will be described. FIG. 12 is a timing diagram showing an operation of the semiconductor storage device 2. The case where the memory cell MC located in the first row and the first column of the memory cell array 11 is the data read target memory cell will be described below by way of example. Also, the case where data "1" is stored in the data read target memory cell MC will be described by way of example.

First, in a normal operation mode, the test enable signal TME indicates the L level. Accordingly, the selector 171 selects and outputs the clock signal CLKA. The selector 172 selects and outputs the clock signal CLKB. The selector 173 directly outputs the clock signal TDECB generated based on the clock signal CLKB.

Accordingly, the write word line WWL is activated in synchronization with the clock signal CLKA (more specifically, the clock signal TDECA generated based on the clock signal CLKA). Further, the read word line UWL1 is activated in synchronization with the clock signal CLKB (more specifically, the clock signal TDECB generated based on the clock signal CLKB) which is asynchronous with the clock signal CLKA. In other words, in the normal operation mode, the data write operation and the data read operation are in an asynchronous relationship.

Next, in a test mode, the test enable signal TME indicates the H level. Accordingly, the selectors 171 and 172 each select and output the test clock signal TCLK. The clock signal TDECB, which is generated based on the test clock signal TCLK, is delayed by the delay unit 178 and output from the selector 173.

Therefore, the write word line WWL is activated in synchronization with the test clock signal TCLK (more specifically, the clock signal TDECA generated based on the test clock signal TCLK). The read word line UWL1 is activated in synchronization with the signal obtained by delaying the test clock signal TCLK by a predetermined period (more specifically, the signal obtained by delaying, by a predetermined period, the clock signal TDECA generated based on the test clock signal TCLK). In other words, the clock generation unit 17 activates the write word line WWL, and further activates the read word line UWL1 after a lapse of a predetermined period. In short, the semiconductor storage device 2 can intentionally create a state in which the word line UWL1 is activated immediately after the word line WWL is activated in the test mode.

It is necessary for the clock generation unit 17 to make the write word line WWL inactive after making the read word line UWL1 inactive. This allows the semiconductor storage device 2 to conduct a test without amplifying the potential of the storage node of the data read target memory cell MC again.

In this manner, the semiconductor storage device 2 according to the fifth embodiment intentionally creates the state in which the word line UWL1 is activated immediately after the word line WW1 is activated in the test mode. This allows the semiconductor storage device 2 to conduct a test to determine whether data can be correctly read out when different memory cells MC in the same row are accessed by the write-only port and the read-only port at the same time.

Note that the clock generation unit 17 is applicable not only to the semiconductor storage device 2, but also to a 2-port SRAM including a write-only port and a read-only port. For example, the clock generation unit 17 is applicable to a semiconductor storage device 3 described below.

The semiconductor storage device 3 includes a plurality of memory cells MC, a plurality of write word lines, a plurality of read word lines, a plurality of write bit line pairs, a plurality of read bit lines, a write word line driver, a read word line driver, a write selection circuit, a read selection circuit, an input driver, a sense amplifier, and the above-described clock generation unit 17. The plurality of memory cells MC are provided in a matrix manner. The plurality of write word lines are respectively provided in a plurality of rows of the memory cells MC. The plurality of read word lines are respectively provided in a plurality of rows of the memory cells MC. The plurality of write bit line pairs are respectively provided in a plurality of columns of the memory cells MC. The plurality of read bit lines are respectively provided in a plurality of columns of the memory cells MC. The write word line driver activates any of the plurality of write word lines. The read word line driver activates any of the plurality of read word lines. The write selection circuit selects any of the plurality of write bit line pairs. The read selection circuit selects any of the plurality of read bit lines. The input driver outputs write data to the write bit line pair selected by the write selection circuit. The sense amplifier amplifies a potential difference between a reference potential and the potential of the read bit line selected by the read selection circuit.

In the first to fifth embodiments described above, the case where the memory cell MC located in the first row and the first column of the memory cell array 11 has been mainly described above byway of example, but the present invention is not limited thereto. The same holds true for the case where another memory cell MC is a data read target memory cell.

In the semiconductor storage devices according to the embodiments described above, the conductivity type (p-type or n-type) of a semiconductor substrate, a semiconductor layer, a diffusion layer (diffusion region), and the like may be reversed. Accordingly, when one of the conductivity types of the n-type and the p-type is defined as a first conductivity type and the other conductivity type is defined as a second conductivity type, the first conductivity type may be the p-type and the second conductivity type may be the n-type. On the contrary, the first conductivity type may be the n-type and the second conductivity type may be the p-type.

Although the invention made by the present inventor has been described in detail above with reference to embodiments, the present invention is not limited to the embodiments described above and can be modified in various manners without departing from the gist of the invention.

The first to fifth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:
1. A semiconductor storage device comprising:
a plurality of first memory cells provided in a matrix manner,
a plurality of first word lines respectively provided in a plurality of rows of the plurality of first memory cells;
a plurality of first bit lines respectively provided in a plurality of columns of the plurality of first memory cells, each of the first bit lines being connected to two or more of the first memory cells;
a first common bit line;
a plurality of second memory cells provided in a matrix manner;
a plurality of second word lines respectively provided in a plurality of rows of the plurality of second memory cells;
a plurality of second bit lines respectively provided in a plurality of columns of the plurality of second memory cells, each of the second bit lines being connected to two or more of the second memory cells;
a second common bit line;
a first selection circuit that connects the first common bit line to a first bit line selected from among the plurality of first bit lines based on a control signal;
a second selection circuit that connects the second common bit line to a second bit line selected from among the plurality of second bit lines based on the control signal;
a word line driver that activates any one of the plurality of first and second word lines;
a reference current supply unit that supplies a reference current to a common bit line among the first and second common bit lines, the common bit line not being electrically connected to a data read target memory cell;
a sense amplifier that amplifies a potential difference between the first and second common bit lines;
an output switching circuit that selectively outputs, as read data, one of an output signal of the sense amplifier and an inverted signal of the output signal, according to an attribute of a data read target memory cell, wherein when the data read target memory cell belongs to the plurality of first memory cells, the output switching circuit outputs an output signal of the sense amplifier as the read data, and when the data read target memory cell belongs to the plurality of second memory cells, the output switching circuit outputs an inverted signal of the output signal of the sense amplifier as the read data, wherein the output switching circuit includes:
- a first PMOS transistor having a source connected to a power supply voltage terminal, and a gate connected to the first common bit line;
- a second PMOS transistor having a source connected to a drain of the first PMOS transistor, a drain connected to an output terminal, and a gate supplied with a determination signal indicating whether or not a data read target memory cell belongs to the plurality of first memory cells;
- a first NMOS transistor having a source connected to a ground voltage terminal, and a gate connected to the first common bit line;
- a second NMOS transistor having a source connected to a drain of the first NMOS transistor, a drain connected to the output terminal, and a gate supplied with an inverted signal of the determination signal;
- a third PMOS transistor having a source connected to the power supply voltage terminal, and a gate connected to the second common bit line;
- a fourth PMOS transistor having a source connected to a drain of the third PMOS transistor, a drain connected to the output terminal, and a gate supplied with an inverted signal of the determination signal;
- a third NMOS transistor having a source connected to the ground voltage terminal, and a gate connected to the second common bit line; and
- a fourth NMOS transistor having a source connected to a drain of the third NMOS transistor, a drain connected to the output terminal, and a gate supplied with the determination signal.

2. The semiconductor storage device according to claim 1, wherein when stored data is read, the first and second memory cells are each electrically connected to only one bit line among the plurality of first and second bit lines.

3. The semiconductor storage device according to claim 1, wherein the first and second memory cells each include:
- first and second inverters connected in a loop shape;
- a first MOS transistor provided between a ground voltage terminal and any one of the plurality of first and second bit lines, turning on and off of the first MOS transistor being controlled according to a potential of a storage node between the first inverter and the second inverter; and
- a second MOS transistor provided in series with the first MOS transistor, turning on and off of the second MOS transistor being controlled according to a potential of any one of the plurality of first and second word lines.

4. The semiconductor storage device according to claim 1, wherein the first and second memory cells each include a MOS transistor provided between a ground voltage terminal and any one of the plurality of first and second bit lines, turning on and off of the MOS transistor being controlled according to a potential of any one of the plurality of first and second word lines.

5. The semiconductor storage device according to claim 1, wherein
the sense amplifier includes:
- a first inverter including a fifth PMOS transistor and a fifth NMOS transistor; and
- a second inverter that includes a sixth PMOS transistor and a sixth NMOS transistor, inverts an output of the first inverter, and outputs the inverted output to an input of the first inverter, and
- the first common bit line and an output of the first inverter are connected to each other, and the second common bit line and an output of the second inverter are connected to each other.

6. The semiconductor storage device according to claim 1, wherein the reference current supply unit starts supplying the reference current in response to an activation of any one of the plurality of first and second word lines.

7. The semiconductor storage device according to claim 1, further comprising a dummy word line that is activated in response to an activation of any one of the plurality of first and second word lines, wherein
the reference current supply unit includes a MOS transistor that controls whether or not to start supplying the reference current according to a potential of the dummy word line, and
a total channel area of MOS transistors connected to the corresponding one of the first and second word lines is substantially equal to a total channel area of MOS transistors connected to the dummy word line.

8. The semiconductor storage device according to claim 7, further comprising a dummy word line driver that supplies a potential to the dummy word line,
wherein the dummy word line driver has substantially the same circuit configuration as that within the word line driver that supplies a potential to each of the first and second word lines.

9. The semiconductor storage device according to claim 1, wherein the reference current supply unit comprises:
- a fifth NMOS transistor having a gate connected to a dummy word line that is activated in response to an activation of any one of the plurality of first and second word lines, and
- a sixth NMOS transistor connected in series with the fifth NMOS transistor and having a gate connected to a bias voltage,
wherein a drain of the fifth NMOS transistor is connected to an output terminal of the reference current supply unit, and a source of the sixth NMOS transistor is connected to a ground voltage terminal.

10. The semiconductor storage device according to claim 1, wherein the first selection circuit is directly connected to the first common bit line and each of the plurality of first bit lines, and
wherein the second selection circuit is directly connected to the second common bit line and each of the plurality of second bit lines.

11. A semiconductor storage device comprising:
- a plurality of first memory cells provided in a matrix manner;
- a plurality of first word lines respectively provided in a plurality of rows of the plurality of first memory cells;
- a plurality of first bit lines respectively provided in a plurality of columns of the plurality of first memory cells, each of the first bit lines being connected to two or more of the first memory cells;
- a first common bit line;
- a plurality of second memory cells provided in a matrix manner;
- a plurality of second word lines respectively provided in a plurality of rows of the plurality of second memory cells;

a plurality of second bit lines respectively provided in a plurality of columns of the plurality of second memory cells, each of the second bit lines being connected to two or more of the second memory cells;
a second common bit line;
a first selection circuit that connects the first common bit line to a first bit line selected from among the plurality of first bit lines based on a control signal;
a second selection circuit that connects the second common bit line to a second bit line selected from among the plurality of second bit lines based on the control signal;
a word line driver that activates any one of the plurality of first and second word lines;
a reference current supply unit that supplies a reference current to a common bit line among the first and second common bit lines, the common bit line not being electrically connected to a data read target memory cell;
a sense amplifier that amplifies a potential difference between the first and second common bit lines; and
an output switching circuit, the output switching circuit comprising:
a first PMOS transistor having a source connected to a power supply voltage terminal, and a gate connected to the first common bit line;
a second PMOS transistor having a source connected to a drain of the first PMOS transistor, a drain connected to an output terminal, and a gate supplied with a determination signal indicating whether or not a data read target memory cell belongs to the plurality of first memory cells;
a first NMOS transistor having a source connected to a ground voltage terminal, and a gate connected to the first common bit line;
a second NMOS transistor having a source connected to a drain of the first NMOS transistor, a drain connected to the output terminal, and a gate supplied with an inverted signal of the determination signal;
a third PMOS transistor having a source connected to the power supply voltage terminal, and a gate connected to the second common bit line;
a fourth PMOS transistor having a source connected to a drain of the third PMOS transistor, a drain connected to the output terminal, and a gate supplied with an inverted signal of the determination signal;
a third NMOS transistor having a source connected to the ground voltage terminal, and a gate connected to the second common bit line; and
a fourth NMOS transistor having a source connected to a drain of the third NMOS transistor, a drain connected to the output terminal, and a gate supplied with the determination signal.

12. A semiconductor storage device comprising:
a plurality of first memory cells provided in a matrix manner;
a plurality of first word lines respectively provided in a plurality of rows of the plurality of first memory cells;
a plurality of first bit lines respectively provided in a plurality of columns of the plurality of first memory cells, each of the first bit lines being connected to two or more of the first memory cells;
a first common bit line;
a plurality of second memory cells provided in a matrix manner;
a plurality of second word lines respectively provided in a plurality of rows of the plurality of second memory cells;
a plurality of second bit lines respectively provided in a plurality of columns of the plurality of second memory cells, each of the second bit lines being connected to two or more of the second memory cells;
a second common bit line;
a first selection circuit that connects the first common bit line to a first bit line selected from among the plurality of first bit lines based on a control signal;
a second selection circuit that connects the second common bit line to a second bit line selected from among the plurality of second bit lines based on the control signal;
a word line driver that activates any one of the plurality of first and second word lines;
a reference current supply unit that supplies a reference current to a common bit line among the first and second common bit lines, the common bit line not being electrically connected to a data read target memory cell;
a sense amplifier that amplifies a potential difference between the first and second common bit lines; and
an output switching circuit, the output switching circuit comprising:
a plurality of first transistors connected to the first common bit line;
a plurality of second transistors connected to the second common bit line;
a plurality of third transistors connected to a determination signal indicating whether or not a data read target memory cell belongs to the plurality of first memory cells; and
a plurality of fourth transistors connected to an inverted signal of the determination signal.

* * * * *